United States Patent [19]

Ward

[11] Patent Number: 5,419,779
[45] Date of Patent: May 30, 1995

[54] STRIPPING WITH AQUEOUS COMPOSITION CONTAINING HYDROXYLAMINE AND AN ALKANOLAMINE

[75] Inventor: Irl E. Ward, Bethlehem, Pa.

[73] Assignee: Ashland Inc., Ashland, Ky.

[21] Appl. No.: 162,429

[22] Filed: Dec. 2, 1993

[51] Int. Cl.⁶ .................. C23G 5/036; C23G 1/14; C23G 1/18; B08B 3/08
[52] U.S. Cl. .......................... 134/38; 134/40; 134/2; 252/173; 252/548; 252/387; 252/392; 252/396; 252/156; 252/158; 252/364; 252/171
[58] Field of Search ............... 252/173, 548, 387, 392, 252/396, 156, 158, DIG. 8, 364, 171; 134/38, 2, 40; 204/146

[56] References Cited

U.S. PATENT DOCUMENTS

| | | | |
|---|---|---|---|
| 3,619,390 | 11/1971 | Dillenberg | 204/146 |
| 3,972,839 | 8/1976 | Murphy | 252/548 |
| 4,067,690 | 1/1978 | Cuisia et al. | 252/392 X |
| 4,078,102 | 3/1978 | Bendz et al. | 252/364 X |
| 4,111,767 | 9/1978 | Kawagishi et al. | 204/146 |
| 4,170,478 | 10/1979 | Case et al. | 430/357 |
| 4,276,186 | 6/1981 | Bakos et al. | 252/158 |
| 4,350,606 | 9/1982 | Cuisia et al. | 252/171 X |
| 4,363,741 | 12/1982 | Gould | 252/548 X |
| 4,509,989 | 4/1985 | Sumansky | 252/548 X |
| 4,617,251 | 10/1986 | Sizensky | 252/170 X |
| 4,626,411 | 12/1986 | Nemes et al. | 252/392 X |
| 4,770,713 | 9/1988 | Ward | 252/171 X |
| 4,786,578 | 11/1988 | Neisius et al. | 134/38 X |
| 4,941,941 | 7/1990 | Austin et al. | 252/79.1 X |
| 5,091,108 | 2/1992 | Harder et al. | 252/392 X |
| 5,279,771 | 1/1994 | Lee | 252/548 |
| 5,334,332 | 8/1994 | Lee | 134/40 X |

FOREIGN PATENT DOCUMENTS 0336400 10/1989 European Pat. Off. .
1244211 7/1986 U.S.S.R. .

OTHER PUBLICATIONS

"Large Diameter Silicon Wafer Cleaning Technology", Semicon/West 1944 month not known.
"Ultraclean Technology: ULSI Processing's Crucial factor", T. Ohmi Microcontamination, Oct. 1988 pp. 49–52 month not known.
Photoresist: Materials and Processes pp. 63, 64 and 246 year and month not known.
ACT-935 Technical Bulletin ACT, Inc. 1994 month not known.
*Alfa Catalog*, Morton Thiokol, Inc., 1986, pp. 24, 42, and 327. Month is unknown.
*Concise Science Dictionary*, Oxford University Press, 1984, p. 649. Month is unknown.

Primary Examiner—Paul Lieberman
Assistant Examiner—Douglas J. McGinty
Attorney, Agent, or Firm—John Lezdey

[57] ABSTRACT

An aqueous stripping composition comprising a mixture of about 55% to 70% by weight of monoethanolamine, about 22.5 to 15% by weight of hydroxylamine and water. The stripping composition is effective to strip photoresists, residues from plasma process generated, organic, metal-organic materials, inorganic salts, oxides, hydroxides or complexes in combination with or exclusive of organic photoresist films at low temperatures without redepositing any substantial amount of metal ions.

5 Claims, No Drawings

STRIPPING WITH AQUEOUS COMPOSITION CONTAINING HYDROXYLAMINE AND AN ALKANOLAMINE

BACKGROUND OF THE INVENTION

1. Field of the Invention

This invention relates to aqueous stripping compositions particularly useful for stripping paints, varnishes, enamels, photoresists and the like, from various substrates. More particularly, the invention relates to aqueous stripping compositions comprising monoethanolamine and hydroxylamine.

2. Description of the Prior Art

Stripping compositions used for removing coatings from substrates have for the most part been highly flammable compositions, compositions generally hazardous to both humans and the environment and compositions which are reactive solvent mixtures evidencing an undesirable degree of toxicity. Moreover, these stripping compositions are not only toxic but their disposal is costly since they must be disposed of as a hazardous waste. In addition, these stripping compositions generally have severely limited bath life and, for the most part, are not recyclable or reusable.

Generally, compositions containing chlorinated hydrocarbons and/or phenolic compounds or other highly caustic and corrosive materials have been employed as stripping compositions for stripping paints, varnishes, lacquers, enamels, photoresists, powder coatings and the like, from substrates such as wood, metal or silicon wafers. Hot caustic compositions are generally employed to remove coatings from metals and methylene chloride compositions to remove coatings from wood. In many cases, the components of the stripping compositions are relatively toxic reactive solvent mixtures and thus must be subject to stringent use conditions and require hazardous chemical handling procedures and wearing of safety garments and apparel by users so as to avoid contact with the stripping compositions.

Additionally, because many of the toxic components of such stripping compositions are highly volatile and subject to unduly high evaporation rates, the stripping compositions require special human and environmental safety precautions to be taken during storage and use of said compositions.

U.S. Pat. No. 4,276,186 to Bakos et al discloses a cleaning composition which includes N-methyl-2-pyrrolidone and an alkanolamine. However, in a comparative study, applicant has found that the use of N-methyl-2-pyrrolidone does not provide a broad spectrum of cleaning as is capable with the composition of the invention.

U.S. Pat. No. 4,617,251 to Sizensky discloses a stripping composition which is prepared with a select amine and an organic polar solvent. The composition is formed utilizing from about 2 to about 98% by weight of amine compound and about 98 to about 2% of an organic polar solvent.

U.S. Pat. No. 4,770,713 to Ward discloses a stripping composition comprising an alkylamide and an alkanol amine.

Recently, OSHA, EPA and other similar federal, state and local governmental regulatory agencies have advocated a shift toward use of more human and environmentally compatible stripping compositions and stripping methods that are not subject to the aforementioned drawbacks and problems.

Moreover, heretofore available photoresist stripping compositions have required unduly long residence times or repeated applications in order to remove certain coatings. In addition, various coatings have resisted removal from certain substrates with these heretofore available stripping compositions. That is, these previously available stripping compositions have not provided adequate or complete removal of certain hard-to-remove coatings from various substrates.

It is, therefore, highly desirable to provide stripping compositions that exhibit substantially no human or environmental toxicity, are water miscible and are biodegradable. It is also desirable to provide stripping compositions that are substantially non-flammable, non-corrosive, evidence relatively little, if any, tendency to evaporate and are generally unreactive and also of little toxicity to humans and are environmentally compatible.

Moreover, it would be desirable to provide photoresist stripping compositions that have a high degree of stripping efficacy and particularly such high degree of stripping at lower temperatures than generally required with prior stripping compositions.

It is also highly desirable that photoresist stripping compositions be provided that exhibit substantially no corrosive effects on the substrate.

It is also desirable that effective stripping compositions be provided that are devoid of undesirable chlorinated or phenolic components and which do not require the use of hot caustic components. Highly desirable are stripping compositions and use thereof that are not considered undesirable by regulatory agencies overseeing their production and use.

It is also most advantageous that stripping compositions be provided with the above-identified desirable characteristics which evidence synergistic stripping action in that the mixtures of components provide stripping efficacy and stripping results not always obtainable with the individual components.

SUMMARY OF THE INVENTION

It has now been found that a suitable stripping composition in which the hereinbefore mentioned disadvantages or drawbacks are eliminated or substantially reduced and in which the range of usefulness of the stripping compositions is greatly extended can be obtained in accordance with the teachings of the present invention.

The novel stripping compositions of the present invention comprise a mixture of:

(a) from about 55% to about 70% by weight of monoethanolamine;

(b) from about 22.5% to about 15% by weight of hydroxylamine, and (c) water.

Preferably, the stripping composition comprises about 62% by weight of monoethanolamine, about 19% by weight of hydroxylamine and the remainder water.

If desired, a corrosion inhibitor may be added up to about 10%, for example, catechol or pyrogallol.

It is advantageous that the stripping composition of the invention is free of other amines so as to avoid corrosion of the photoresist substrate and reduction of stripping efficiency.

The novel stripping compositions of the invention exhibit synergistically enhanced stripping action and stripping capabilities at low temperatures not possible from the use of the individual components or in combination with other stripping components such as ethoxyethanolamine or alkylamides.

The stripping compositions of the invention provide an effective stripping action as well as prevent metal ion redeposition, for example, alkaline earth and alkali metal ion redeposition on the substrate. This is surprising in view of their different basicity. Monoethanolamine has a base dissociation constant (K) of $3.5 \times 10^{-5}$ and hydroxylamine has a K value of $9.1 \times 10^{-9}$.

It is a general object of the invention to provide a stripping composition which is effective at low temperatures.

It is another object of the invention to provide a photoresist stripping composition which is non-corrosive.

It is a further object of the invention to provide a photoresist stripping composition which inhibits redeposition of metal ions.

It is yet another object of the invention to provide a method for stripping a coated substrate which can be accomplished at low temperatures which does not cause redeposition of metal ions.

DETAILED DESCRIPTION OF THE PREFERRED EMBODIMENTS

The stripping compositions of the invention comprise a mixture of:
(a) about 55% to about 70% by weight of monoethanolamine;
(b) about 22.5 to about 15% by weight of hydroxylamine, and
(c) the remainder water.

A preferred photoresist stripping composition consists of about 62% by weight of monoethanolamine, about 19% by weight of hydroxylamine, and water.

If desired, corrosion inhibitors in an amount of up to about 10% by weight, preferably about 5%, may be added to the stripping compositions. Suitable inhibitors are disclosed in copending application Ser. No. 07/983,257 filed Nov. 30, 1992, which is herein incorporated by reference. Preferred inhibitors include catechol and pyrogallol, anthranilic acid, gallic acid, gallic esters, and the like.

The stripping compositions of this invention are especially useful and advantageous for numerous reasons among which may be mentioned the following. The stripping compositions are water soluble, non-corrosive, non-flammable and of low toxicity to the environment. The stripping compositions evidence higher stripping efficiency at low temperatures for a wide variety of coatings and substrates. They are particularly suitable for removal of photoresists and residues from plasma processing used in integrated circuit fabrication since they also prevent the redeposition of metal ions, especially sodium and potassium ions.

The stripping compositions are easily prepared by simply mixing the components at room temperature. Preferably, the hydroxylamine is dissolved in the water and the monoethanolamine is then combined with the mixture. If desired, an inhibitor can then be added.

The method of the invention is carried out by contacting an organic or metal-organic polymer, inorganic salt, oxide, hydroxide or complex or combination thereof as a film or residue, i.e. sidewall polymer (SWP). with the described stripping composition. The actual conditions, i.e., temperature, time, etc. depend on the nature and thickness of the complex (photoresist and/or sidewall polymer) material to be removed, as well as other factors familiar to those skilled in the art. In general, for photoresist stripping, the photoresist is contacted or dipped into a vessel containing the stripping composition at a temperature between 40°-75° C. for a period of about 5-25 minutes and then washed with water.

Examplificative organic polymeric materials include positive photoresists, electron beam resists, X-ray resists, ion beam resists, and the like. Specific examples of organic polymeric materials include positive resists containing phenolformaldehyde resins or poly (p-vinylphenol), polymethylmethacrylate-containing resists, and the like. Examples of plasma processing residues (sidewall polymer) include among others; metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, aluminum, aluminum alloys, copper, copper alloys, etc. The hydroxylamine utilized in the invention is commercially available as a 50% aqueous solution from Nissin Chemical Industry Company, Tokyo, Japan.

The effectiveness and unexpected nature of the stripping compositions of the invention is illustrated, but not limited by, the data presented in the following examples. Unless otherwise specified, all parts and percentages are by weight.

EXAMPLE 1

In order to demonstrate the efficiency of the different concentrations of the stripping compositions the following tests were conducted.

Metal/silicon wafer substrates containing commercial photoresists and plasma generated SWP residues labeled as "veils" were post-baked at 180° C. for 60 minutes. The substrates were cooled and dipped into vessels containing a stripping composition and stirred with a magnetic stirrer. There was a vessel containing a stripping composition maintained at a temperature of 50° C. and another at 55° C. The contact time with the compositions was 30 minutes. The substrates were washed with deionized water and dried with nitrogen. The results were determined by optical microscopy and scanning electron microscopy inspection and were as follows:

| Test | % Monoethanol Amine | % Hydroxyl Amine | Polymer Removal 50° C. | 55° C. |
| --- | --- | --- | --- | --- |
| 1 | 25 | 75 | small veil residue widespread | small veil residue widespread |
| 2 | 40 | 60 | small veil residue widespread | small veil residue scattered |
| 3 | 50 | 50 | complete removal | small veil residue scattered |
| 4 | 60 | 40 | slight residue | complete removal |
| 5 | 62 | 38 | complete removal | complete removal |
| 6 | 75 | 25 | small veil residue widespread | small veil residue widespread |
| 7 | 80 | 20 | small veil residue | severe residue |

-continued

| Test | % Monoethanol Amine | % Hydroxyl Amine | Polymer Removal 50° C. | 55° C. |
| --- | --- | --- | --- | --- |
| 8 | 90 | 10 | widespread severe residue | severe residue |

EXAMPLE 2

The following test was performed to compare the composition of the invention with a commercial product.

Metal substrates containing commercial resists were post-baked at 180° C. for 60 minutes. The substrates were cooled and dipped into vessels containing the stripping compositions and stirred with a magnetic stirrer. There was a vessel containing a stripping composition which was maintained at 60° C. and another at 90° C. The contact time was 20 minutes. The substrates were washed with deionized water and viewed for corrosion and polymer removal. The results were as follows:

| | Time (min) | Temp. °C. | % Polymeric Removal | Corrosion |
| --- | --- | --- | --- | --- |
| Composition 1 | | | | |
| Monoethanolamine 60% | 20 | 65 | 100 | No |
| Hydroxylamine 18.5% Water 18.5% Catechol 5% | 20 | 90 | 100 | No |
| Composition 2 | | | | |
| Aminoethoxyethanol amine | 20 | 65 | N/C | No |
| Hydroxylamine Water Catechol | 20 | 90 | 100 | Pitting |

EXAMPLE 3

Surface sodium data were collected for composition 1 and composition 2 of Example 2. Device wafers were tested and inspected for sidewall polymer (SWP) removal. Surface sodium was analyzed by SIMS (Secondary Ion Mass Spectroscopy) on multiple substrate types. The substrates included tetraethylorthosilicate (TEOS) on Al-Si-Cu and thermal oxide over Al-Si-Cu. The plasma etch was performed on an AME8110 etcher employing $CHF_3/O_2$ gas mixture. The surface sodium results were as follows:

| | Sodium/$cm^2$ |
| --- | --- |
| Composition 1 | 1.4E + 12 |
| Composition 2 | >3.4E + 12 |

What is claimed is:

1. A process for removing an organic coating from a coated substrate comprising applying to said coated substrate a stripping effective amount of the stripping composition consisting essentially of a mixture of:
   a) about 55% to about 70% by weight of monoethanolamine;
   b) about 22.5 to about 15% by weight of hydroxylamine, and
   c) the balance being water, permitting said stripping composition to reside on said coated substrate for a stripping effective period of time and removing the coating from said substrate.

2. A process for removing an organic coating from a coated substrate comprising applying to said coated substrate a stripping effective amount of the stripping composition consisting of about 62% by weight of monoethanolamine, about 19% by weight of hydroxylamine, and the balance being water, permitting said stripping composition to reside on said coated substrate for a stripping effective period of time and removing the coating from said substrate.

3. The process of claim 1 further consisting essentially of up to about 10% by weight of a corrosion inhibitor.

4. The process of claim 3 wherein said inhibitor is selected from the group consisting of catechol, pyrogallol, anthranilic acid, gallic acid and gallic ester.

5. The process of claim 1 wherein said coated substrate is a photoresist.

* * * * *